United States Patent [19]

Konrad et al.

[11] Patent Number: 5,786,122
[45] Date of Patent: Jul. 28, 1998

[54] PHOTOSENSITIVE MIXTURE COMPRISING A DIAZONIUM SALT, AN AMPHOPHILIC POLYMER AND A NONIONIC SURFACTANT

[75] Inventors: Klaus-Peter Konrad, Ingelheim; Willi-Kurt Gries, Wiesbaden; Guenter Jung, Taunusstein, all of Germany

[73] Assignee: AGFA-Gevaert AG, Leverkusen, Germany

[21] Appl. No.: 519,518

[22] Filed: Aug. 25, 1995

[30] Foreign Application Priority Data

Aug. 29, 1994 [DE] Germany .................. 44 30 680.6

[51] Int. Cl.$^6$ ........................................ G03F 7/021
[52] U.S. Cl. .................. 430/157; 430/175; 430/176; 430/278.1; 430/302
[58] Field of Search ........................ 430/175, 176, 430/157, 302, 278.1

[56] References Cited

U.S. PATENT DOCUMENTS

| 4,092,170 | 5/1978 | Houtermans et al. | 96/91 R |
| 4,123,276 | 10/1978 | Kita et al. | 96/91 R |
| 4,275,138 | 6/1981 | Kita et al. | 430/157 |
| 4,288,520 | 9/1981 | Sprintschnik et al. | 430/169 |
| 4,568,628 | 2/1986 | Eklund | 430/175 |
| 5,300,397 | 4/1994 | Aoshima | 430/176 |
| 5,478,690 | 12/1995 | Kanda et al. | 430/176 |
| 5,482,816 | 1/1996 | Murata et al. | 430/176 |

FOREIGN PATENT DOCUMENTS

| 31 18039 | 3/1982 | Germany . |
| 35 16387 | 11/1985 | Germany . |
| 2 081 916 | 2/1982 | United Kingdom . |

*Primary Examiner*—John S. Chu
*Attorney, Agent, or Firm*—Foley & Lardner

[57] ABSTRACT

A photosensitive mixture which contains a polycondensation product of an aromatic diazonium salt, a water-soluble amphophilic polymeric binder having a mean molecular weight $M_w$ of 5000 to 100,000 and a nonionic surface-active compound having a molecular weight of 150 to 2000 is suitable for the production of printing plates, particularly offset printing plates, which can be developed with pure water and are notable for a rapid ink take-up and long print run.

24 Claims, No Drawings

PHOTOSENSITIVE MIXTURE COMPRISING A DIAZONIUM SALT, AN AMPHOPHILIC POLYMER AND A NONIONIC SURFACTANT

BACKGROUND OF THE INVENTION

1. Field of the Invention

The invention relates to a photosensitive mixture which contains a polycondensation product of an aromatic diazonium salt, a polymeric binder, and a surfactant. The mixtures are useful, for example, for the production of offset printing plates which can be processed to produce offset printing forms, for example, by imagewise exposure and washing-out of the unexposed regions of the photosensitive layer with water.

2. Description of Related Art

Photosensitive mixtures and recording materials of the generic class mentioned above are disclosed in DE-A 26 07 091 (equivalent to U.S. Pat. No. 4,092,170). The mixtures described contain water-insoluble polymeric binders and at least 10, preferably 20 to 40% by weight of a water-soluble surface-active agent, in particular a quaternary ammonium salt. They can be developed with pure water, generally only with mechanical assistance. However, the print run of the printing forms obtained therewith is limited. The oleophilicity is also limited because of the high content of hydrophilic surface-active agent, with the result that the image areas take up sufficient ink only after a fairly large number of impressions.

EP-B 8038 (equivalent to U.S. Pat. No. 4,288,520) describes a photosensitive recording material which has a layer composed of a dispersible water-insoluble polymer, a water-soluble diazonium salt condensation product, and a wetting agent. This recording material can also not be developed with pure water without mechanical assistance and even then, it is frequently difficult to completely remove the layer residues completely from the nonimage areas.

DE-A 30 31 302 (equivalent to GB-A 2,081,916) describes a photosensitive recording material for the production of printing plates which carries, on a layer base, a photosensitive layer composed of a water-soluble diazonium salt polycondensation product and, on top thereof, a second photosensitive layer composed of a water-insoluble condensation product of diphenylamine diazonium salt and formaldehyde, precipitated as a salt of a benzophenone sulfonic acid, and a water-insoluble oleophilic polymer. The recording material is developed with mains water at elevated temperature. It is difficult to achieve a clean differentiation in accordance with image areas and nonimage areas with this processing. The application of two layers is also technologically expensive and requires particular care.

DE-A 33 28 019 (equivalent to U.S. Pat. No. 4,568,628) describes a photosensitive recording material for the production of printing plates which carries a photosensitive layer composed of a condensation product of a diazodiarylamine with formaldehyde, a water-dispersible, water-insoluble polymer and a dispersing agent. The recording material can be developed with water. Here, again, the development does not always result in a clean removal of the nonimage areas; the ink take-up during printing is delayed and the print run is limited.

SUMMARY OF THE INVENTION

The object of the invention is to provide a photosensitive mixture and recording material for the production of printing plates which can be developed with pure water, without leaving residue, and without mechanical assistance such as rubbing or brushing.

It is also an object of the invention to provide printing plates and methods for their production having rapid ink take-up during proof printing without a tendency to scumming and with which long print runs can be achieved.

It is also an object to provide photosensitive mixtures and printing plates which have good shelf life even at relatively high atmospheric humidity.

In accordance with these objectives, there is provided a photosensitive mixture which includes a polycondensation product of an aromatic diazonium salt, a polymeric binder which comprises a water-soluble amphophilic polymer having a mean molecular weight Mw of 5,000 to 100,000, and a nonionic surfactant which has a molecular weight of 150 to 2,000.

In accordance with these objectives, there is also provided a photosensitive recording material useful for the production of printing forms comprising a base layer and a photosensitive layer, wherein the photosensitive layer comprise a photosensitive mixture as set forth above.

In accordance with these objectives, there is also provided a method for the production of printing plates, which comprises imagewise exposing a photosensitive material as set forth about and washing out the unexposed layer regions with water.

Further objects, features, and advantages of the present invention will become apparent from the detailed description of preferred embodiments that follows.

DETAILED DESCRIPTION OF THE PREFERRED EMBODIMENTS

According to the invention, a photosensitive mixture is provided which contains a polycondensation product of an aromatic diazonium salt, a polymeric binder, and a low molecular weight surfactant. The polymeric binder is a water-soluble amphophilic polymer having a mean molecular weight $M_w$ of 5,000 to 100,000. The surfactant is at least one nonionic compound having a molecular weight of 150 to 2000.

As photosensitive substance, the mixture contains a condensation product of an aromatic diazonium salt. Any such condensation products can be used. Such condensation products are known and are described, for example, in DE-A 12 14 086 (equivalent to U.S. Pat. No. 3,235,384 hereby incorporated by reference). They are generally prepared by condensation of a polynuclear aromatic diazonium compound, preferably of substituted or unsubstituted diphenylamine-4-diazonium salts, with active carbonyl compounds, preferably formaldehyde, in strongly acid medium, preferably concentrated phosphoric acid.

U.S. Pat. No. 3,867,147 and 4,021,243, both incorporated by reference, describe further useful condensation products of this type, which additionally contain units formed by condensation which are free of diazonium salt groups and are preferably derived from one or more aromatic amines, phenols, phenol ethers, aromatic thioethers, aromatic hydrocarbons, aromatic heterocyclic compounds, or organic acid amides.

The diazonium salt polycondensation products preferably contain repeating $R-N_2X$ units which are joined to one another by linking members which are derived from condensable carbonyl compounds, in particular formaldehyde where R is an aromatic radical containing at least two benzene rings and X is an anion.

Also, the diazonium salt polycondensation products may comprise repeating units A—$N_2X$ and B units which are joined to one another by linking members, where A is the radical of an aromatic diazonium compound which can be condensed with formaldehyde and B is the radical of a compound which is free of diazonium groups and can be condensed with formaldehyde, in particular the radical of an aromatic amine, of a phenol, of a phenol ether, of an aromatic thioether, of an aromatic hydrocarbon, of an aromatic heterocyclic compound or of an organic acid amide. Moreover, it may be a product comprising recurring units A—$N_2X$ and B, which are linked by bivalent intermediate members derived from a condensable carbonyl compound.

The diazonium salt units A—$N_2X$ are preferably derived from compounds of the formula $(R^1—R^2—)_pR^3—N_2X$, where X is an anion which effects a solubility in water, p is an integer from 1 to 3, $R^1$ is an aromatic radical containing at least one position capable of condensation with an active carbonyl compound, $R^2$ is a single bond or one of the groups:

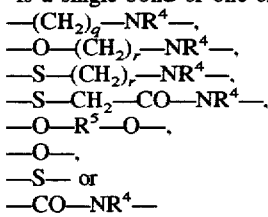

—CO—$NR^4$— in which q is an integer from 0 to 5, r is an integer from 2 to 5, $R^4$ is hydrogen, an alkyl group containing 1 to 5 carbon atoms, an aralkyl group containing 7 to 12 carbon atoms or an aryl group containing 6 to 12 carbon atoms, and $R^5$ is an arylene group containing 6 to 12 carbon atoms, and $R^3$ is an optionally substituted (p+1)-valent benzene radical.

If the (p+1)-valent benzene radical is substituted, the substituent preferably is a $(C_1-C_4)$alkoxy or $(C_1-C_6)$-alkyl group. Preferably, p is 1, which means that $R^3$ preferably is a, optionally substituted, phenylene group.

The anion X is preferably chloride, sulfate, phosphate or an optionally substituted alkane sulfonate containing 1–4 carbon atoms, for example, the methane sulfonate or an aminoalkane sulfonate, as described in EP-A 224 162, hereby incorporated by reference. The optionally present substituents of the alkane sulfonates preferably are amino or alkoxy groups.

Preferred are condensation products which are derived from optionally substituted diphenylamine-4-diazonium salts, particularly the 3-methoxydiphenylamine-4-diazonium salts, and the readily accessible condensation products of the latter with formaldehyde. The optionally present substituents preferably are $(C_1-C_4)$ alkoxy or $(C_1-C_6)$alkyl groups.

The condensation can be carried out as desired, in particular, in concentrated sulfuric, phosphoric or methanesulfonic acid, in particular in phosphoric acid. In the latter case, the condensation product can be used as crude condensate, i.e., as the approximately 50%-strength solution in phosphoric acid produced during the condensation. This has the advantage that phosphoric acid, which is preferred for the purpose of stabilizing the condensation product in the mixture, is already present. Sulfuric, methanesulfonic, p-toluenesulfonic, and citric acid are also suitable for the stabilization. An excess of acid is frequently advantageous, with the result that still more phosphoric acid can also additionally be added to that contained in the crude condensate.

The photosensitive mixture according to the invention furthermore contains a water-soluble amphophilic binder, i.e., a polymeric binder containing both hydrophilic and hydrophobic or oleophilic groups. The polymer generally has a mean molecular weight $M_w$ of approximately 5,000 to 100,000, preferably of 10,000 to 50,000. Any such polymers can be used. Particularly advantageous are copolymers of long-chain, preferably unbranched α-olefins, in particular those containing 10 to 20 carbon atoms, and α,β-unsaturated acids, particularly acrylic or methacrylic acid, which are partially esterified with hydrophilic ester groups, for example, polyoxyethylene groups containing 6 to 10 oxyethylene units. Suitable water-soluble polymers of this type are commercially available (for example, ®Dapral GE 202, from Akzo, N.V.).

In addition, the photosensitive mixture according to this invention may contain a water-soluble, non-ampho-philic polymeric binder, such as polyvinylpyrrolidone. The developability of a recording material prepared using such a binder is as good as that of a recording material prepared without the water-soluble, non-amphophilic binder (see Example 4 b). However, the ink acceptance of printing plates prepared with such a mixture as well as their print run are reduced. Therefore, the photosensitive mixture of this invention preferably does not contain a water-soluble, non-amphophilic binder.

In addition to these polymers, which are themselves surface-active, the photosensitive mixture furthermore contains at least one low-molecular-weight monomeric or oligomeric surface-active compound. This additive has the effect that printing plates can be developed immediately without haze by washing with water without mechanical assistance and without prior soaking or swelling. The low-molecular-weight surfactants are preferably nonionic and preferably contain polyoxyalkylene chains containing approximately 3 to 15 units. The molecular weights $M_w$ of these low-molecular-weight compounds are generally in the range from 150 to 2,000, preferably from 200 to 1,500.

Any such surfactants can be used. Types of surface-active compounds which are particularly suitable for the purposes of the invention include:

fatty alcohol polyglycol ethers [R—O—$(C_2H_3R'—O)_n$H], fatty acid polyglycol esters [R—COO—$(C_2H_3R'O)_n$H], alkylphenol polyglycol ethers [R"—$C_6H_4$—O—$(C_2H_3R'O)_n$H], and fatty acid esters of higher alkanols R—COO—R"

in which

R is a $C_9$–$C_{19}$-alkyl radical,

R' is hydrogen or methyl,

R" is a $C_7$–$C_{15}$-alkyl radical, and n is an integer from 3 to 15.

The polyglycol ether groups may be polyoxyethylene, polyoxypropylene or poly(oxyethylene/oxypropylene) groups. Combinations of fatty alcohol polyglycol ethers with alkylphenol polyglycol ethers are used with particular advantage, preferably in a quantitative ratio of (0.2 to 5):1.

The surfactant is preferably a mixture of an alkylphenol polyglycol ether and an ether of a polyglycol with an alkanol containing 6 to 20 carbon atoms, especially wherein the polyglycol ethers are ethers of polyethylene glycol or polypropylene glycol or of mixed polyethers composed of oxyethylene and oxypropylene units.

Plasticizers, adhesion promoters, leveling agents, dyes, pigments, color formers, and/or sensitizers may furthermore be added to the mixtures. The nature and amount of these additives depend on the field of application envisaged for the photosensitive mixture.

The dyes and/or pigments may act both as contrast agents and as layer consolidators. Suitable dyes are specified, for example, in U.S. Pat. Nos. 3,218,167 and 3,884,693. Particularly suitable are, for example, Victoria pure blue FGA, renol blue B2G-H (C.I. 74160), crystal violet or rhodamine 6 GDN (C.I. 45160), Metanil yellow (C.I. 13065) or phenylazodiphenylamine may be used to increase the image contrast after exposure.

Within the scope of the invention, the following distribution according to weight of the most important additives in the photosensitive mixture are preferred, based on the content of nonvolatile constituents, i.e., the constituents of the solid photosensitive layer obtained after the evaporation of the solvent.

Binder: 10 to 60, preferably 15 to 50%
Diazonium salt polycondensation product: 25 to 50, preferably 30 to 40%
Acid: 10 to 40, preferably 15 to 30%
Surfactant: 2 to 40, preferably 4 to 20%
Dye or pigment: 0 to 12, preferably 2 to 8%

The photosensitive mixture may be coated on any desired base material in any desired manner. Generally, the base material is coated with the mixture from suitable organic solvents or solvent mixtures, and generally by casting, spraying or immersing.

Suitable solvents include alcohols, ketones, esters, ethers, and the like. In this connection, partial ethers of glycols or of ketoalcohols, for example, ethylene or propylene glycol monomethyl ether, have been found to be beneficial solvents.

When used in offset printing, the finished coating solution is applied to a layer base suitable for offset printing. This can be done in any desired manner, such as by spinning-on, spraying, immersion, application by means of rollers or with the aid of a liquid film and also depends on the properties of the material to be coated. The layer thickness of the dried layer may be controlled as desired and is generally between 0.1 and 2.0, preferably between 0.2 and 1.0 $g/m^2$. For a residence time of not more than 2 minutes in the drier, the drying temperature should not exceed 120° C.

Suitable as layer base are a wide variety of materials such as paper, aluminum, steel, and plastics sheets. Preferably used for the production of offset printing plates is aluminum which is grained mechanically, chemically or with the aid of electric current and/or anodized. The aluminum is advantageously pretreated before coating in a known manner with hydrophilizing substances such as phosphonic acids, silicates, fluorozirconates, polyacrylamide, and the like, in particular with aqueous solutions of polyvinylphosphonic acid.

To produce the printing plates, the recording material is exposed in a known manner under a master using customary light sources which emit as high as possible a spectral component in the near ultraviolet region. The exposure can also be done by irradiation using shortwave lasers with the appropriate power.

During the irradiation, the layer cures in those areas on which the light acts and thereby becomes substantially insoluble. The unexposed parts of the layer, which remain soluble, are washed out and removed by spraying with mains water without additional mechanical treatment. Such a development can be carried out using a hand spray in a developer tank. If development machines are used, the plates are preferably developed by introduction into the separate inlet (if present) to the rinsing station upstream of the gumming station. This procedure offers the possibility of processing both positive-working and negative-working printing plates in one processing machine, and this results in a substantial saving on costs and space requirements for the printer. Following the development, the plate can be gummed in a standard manner, i.e., coated with a preservative based on hydrophilic colloids such as dextrin or gum arabic etc., and later presented for proof printing.

The following examples explain preferred embodiments of the method according to the invention. Unless otherwise specified, percentages are percentages by weight. If 1 ml is chosen as part by volume (pbv), 1 g should be taken as part by weight (pbw). The examples are for illustrative purposes only and do not limit the invention.

EXAMPLE 1

Coating solutions composed of
(a) 14 pbw of a diazonium salt polycondensation product, prepared from 1 mol of 3-meth-oxydiphenylamine-4-diazonium sulfate and 1 mol of formaldehyde in 85%-strength phosphoric acid, used as crude condensate (50%-strength solution in $H_3PO_4$),
6 pbw of a copolymer of acrylic acid and 1,2-hexadecene (molar ratio 2:1), 50% of whose carboxyl groups are esterified with polyethylene glycol (6–10 ethyleneoxide units); mean molecular weight $M_w$ 20 000 (®Dapral GE 202 from Akzo N.V.),
3 pbw of phosphoric acid (85%-strength),
1 pbw of a nonylphenol polyethylene glycol ether containing 30 ethylene oxide units,
1 pbw of an ether composed of branched primary $C_9$–$C_{15}$-alcohols and mixed polyethers comprising 2–8 oxyethylene and 1–6 oxypropylene units, and
1 pbw of Victoria blue FBR (C.I. Basic Blue 55) in
634 pbw of ethanol and
340 pbw of diethylene glycol monomethyl ether and
(b) 10 pbw of a diazonium salt polycondensation product prepared from 1 mol of diphenyl-amine-4-diazonium sulfate and 1 mol of formaldehyde in phosphoric acid, used as crude condensate (50%-strength solution in concentrated $H_3PO_4$),
8 pbw of the copolymer specified under (a),
3 pbw of phosphoric acid (85%-strength),
2 pbw of a nonylphenol polyethylene glycol ether containing 15 ethylene oxide units,
2 pbw of the mixed polyether specified under (a) and
1 pbw of Victoria blue FBR in
634 pbw of ethanol and
340 pbw of diethylene glycol monomethyl ether were applied to an aluminum plate which was electrochemically grained in hydrochloric acid and then anodized in sulfuric acid and which had been aftertreated beforehand by short immersion in an aqueous polyvinyl-phosphonic acid solution (2.2 g/l, 60° C.) and dried for 2 min in a circulating-air drying oven at 100° C. so that a layer weight of 0.3 to 0.5 $g/m^2$ then resulted. The printing plates obtained were then exposed for 50 s under a negative master using a metal-halide lamp with a power of 5 kW and then developed by washing-off, optionally with distilled water or mains water.

The type of development comprises two different techniques:

(I) Rinsing-off with a hand spray followed by a brief final wipe with a plush tampon or the like;

(II) Developing in the rinsing station upstream of the gumming station of a commercial offset plate processing installation with squeegeeing and drying of the plates (optionally, with gumming).

With regard to tonal range and continuous-tone wedge coverage, both development techniques yielded equivalent reproductions of the master without substantial color haze in the nonimage areas, even very fine screen or line elements being reproduced in differentiated form. After preservation, the plates were clamped in a sheet-fed offset printing press and yielded over 100 000 (1a) and around 80,000 good impressions (1b), respectively. It was possible to store the copying materials produced in accordance with Example 1 in a climatic test cabinet at 85% relative atmospheric humidity and 30°–35° C. for more than 24 h and in a circulating-air drying oven at 50° C. for 7 days without the plates having a tendency during the processing to the formation of residual hazes in the nonimage areas or to substantially altered tonal reproduction.

EXAMPLE 2

A coating solution composed of 10 pbw of the diazonium salt polycondensation product specified in Example 1a, 10 pbw of the copolymer specified in Example 1a, 2 pbw of phosphoric acid (85%-strength), 1 pbw of the nonylphenol ether specified in Example 1a, 1 pbw of the mixed polyether specified in Example 1a and 1 pbw of crystal violet (C.I. 42555) in 635 pbw of ethanol and 340 pbw of diethylene glycol monomethyl ether was applied to an aluminum plate electrochemically grained in dilute aqueous nitric acid and anodized and aftertreated as in Example 1 so that a layer weight of 0.3 g/m$^2$ was obtained after drying.

The processing was carried out as in Example 1. Here, again, very well and completely developed printing forms of high resolution were obtained which were notable during printing in an offset printing press for rapid ink take-up (7–10 sheets) and a long print run (approximately 80 000 sheets). The storage capability did not differ from that of the plates produced in Example 1.

EXAMPLE 3

The solid components specified in Example 1a were dissolved in 975 g of fully demineralized water. The solution was applied to an aluminum plate pretreated as in Example 1 to yield a layer weight of 0.38 g/m$^2$. The copying material obtained in this way still did not exhibit substantially altered reproduction compared with the development of fresh plates during a storage test at increased atmospheric humidity even after 48 h. The copying and printing performance essentially corresponded to that of the printing plates described in Example 1.

EXAMPLE 4a (COMPARISON EXAMPLE)

A coating solution composed of 10 pbw of the diazonium salt polycondensation product specified in Example 1a, 5 pbw of polyvinylpyrrolidone (®Luviskol K 90 supplied by BASF AG), 2 pbw of phosphoric acid (85%-strength), 1 pbw of the nonylphenol ether specified in Example 1a, 2 pbw of the mixed polyether specified in Example 1a and 1 pbw of Victoria blue FBR in 639 pbw of ethanol and 340 pbw of diethylene glycol monomethyl ether was applied to an aluminum plate pretreated as in Example 1 so that a layer weight of 0.45 g/m$^2$ was obtained after drying.

During the development of the exposed plate by technique I (Example 1), a printing form was produced which had a light blue haze on the nonimage areas, but which still did not result in scumming when inked in the printing press. A normal development by technique II was not possible with this plate, strong strip-like layer residues which immediately took up printing ink during proof printing remaining on the non-image areas.

EXAMPLE 4b (LESS PREFERRED EMBODIMENT)

6 pbw of the copolymer specified in Example 1a were additionally added to the coating solution from Example 4a and aluminum plates in accordance with Example 1 were coated with this modified solution to yield a layer weight of 0.50 g/m$^2$. A copying material was obtained which could be developed cleanly after exposure (50 s, 5 kW) both by technique I and by technique II and also exhibited markedly better properties during the storage test under high atmospheric humidity (still developable without haze after 24 h at 85% R.H./30–35° C.; however, the layer then exhibited strong de-inking symptoms).

However, a comparison of ink take-up and print run with the data for Example 1 clearly revealed the disadvantages:

| Example | Ink take-up (sheets) | Print run (sheets) |
| --- | --- | --- |
| 1a | 10 | >100,000 |
| 1b | 14 | approx. 80,000 |
| 4a | approx. 100 | approx. 50,000 |
| 4b | approx. 40 | 40,000–50,000 |

EXAMPLE 5 (COMPARISON EXAMPLE)

(a) A coating solution in accordance with Example 1a was made up without adding the copolymer and applied to a suitable aluminum plate to yield a dry layer weight of 0.35 g/m$^2$. Although it was possible to develop the copying layer obtained after exposure by technique I, strip-like residual hazes remained behind on processing by technique II. A proper development was no longer possible after a one-day humidity storage. The plate exhibited marked residual haze even with final wiping; in addition, the lack of the emulsifier action of the copolymer was manifested in that individual, strongly inked spots were visible after development, particularly on the nonimage areas.

(b) Instead of the copolymer, the two low-molecular-weight surfactants (1 pbw in each case) were omitted from the coating solution of Example 1a. Recording layers were obtained which could be developed in a haze-free fashion only by technique I. After development, these plates had heavy layer residues in the nonimage areas in the storage test both at 85% R.H./30–35° C. for 24 h and at 50° C. in the circulating-air drying oven for 3 days.

Other embodiments of the invention will be apparent to those skilled in the art from consideration of the specification and practice of the invention disclosed herein.

What is claimed is:

1. A photosensitive mixture which comprises a polycondensation product of an aromatic diazonium salt, a polymeric binder which comprises a water-soluble amphophilic polymer having a mean molecular weight $M_w$ of 5,000 to 100,000, and a nonionic surfactant which has a molecular weight $M_w$ of 150 to 2,000.

2. A photosensitive mixture as claimed in claim 1, wherein the surfactant comprises one or more of a fatty alcohol polyglycol ether, a fatty acid polyglycol ester, an alkylphenol polyglycol ether, or a fatty acid ester of higher alkanol.

3. A photosensitive mixture as claimed in claim 1, wherein the surfactant comprises a mixture of an alkylphenol polyglycol ether and an ether of a polyglycol with an alkanol containing 6 to 20 carbon atoms.

4. A photosensitive mixture as claimed in claim 3, wherein the polyglycol ethers are ethers with polyethylene glycol or polypropylene glycol or a mixed polyether including oxyethylene and oxypropylene units.

5. A photosensitive mixture as claimed in claim 1 wherein the water-soluble amphophilic polymer comprises a copolymer comprising units of an olefin containing 10 to 20 carbon atoms, an α,β-unsaturated carboxylic acid, and an ester of said α,β-unsaturated carboxylic acid with a polyethylene glycol.

6. A photosensitive mixture as claimed in claim 5, wherein the polyethylene glycol contains 6 to 10 oxyethylene units.

7. A photosensitive mixture as claimed in claim 1, wherein the binder essentially consists of said water-soluble amphophilic polymer.

8. A photosensitive mixture as claimed in claim 1, wherein the diazonium salt polycondensation product contains repeating R—$N_2$X units which are joined to one another by linking members which are derived from condensable carbonyl compounds, where R is an aromatic radical containing at least two benzene rings and X is an anion.

9. A photosensitive mixture as claimed in claim 8, wherein the condensable carbonyl compound comprises formaldehyde.

10. A photosensitive mixture as claimed in claim 1, wherein the diazonium salt polycondensation product comprises repeating A—$N_2$X and B units which are joined to one another by linking members, where A is the radical of an aromatic diazonium compound which can be condensed with formaldehyde and B is the radical of a compound which is free of diazonium groups and can be condensed with formaldehyde.

11. A photosensitive mixture as claimed in claim 10, where the linking members are methylene units derived from condensable carbonyl compounds and wherein B is selected from an aromatic amine, a phenol, a phenol ether, an aromatic thioether, an aromatic hydrocarbon, an aromatic heterocycle, or an organic acid amide.

12. A photosensitive mixture as claimed in claim 10, wherein the diazonium polycondensation product is a product containing repeating A—$N_2$X and B units which are joined by divalent linking members derived from a condensable carbonyl compound, where the A—$N_2$X units are derived from compounds of the formula $(R^1$—$R^2$—$)_pR^3$—$N_2$X and where X is an anion which effects a solubility in water, p is an integer from 1 to 3, $R^1$ is an aromatic radical containing at least one position capable of condensation with an active carbonyl compound, $R^2$ is a single bond or one of the groups:

—$(CH_2)_q$—$NR^4$—,
—O—$(CH_2)_r$—$NR^4$—,
—S—$(CH_2)_r$—$NR^4$—,
—S—$CH_2$—CO—$NR^4$—,
—O—$R^5$—O—,
—O—,
—S— or
—CO—$NR^4$— in which q is an integer from 0 to 5, r is an integer from 2 to 5, $R^4$ is hydrogen, an alkyl group containing 1 to 5 carbon atoms, an aralkyl group containing 7 to 12 carbon atoms or an aryl group containing 6 to 12 carbon atoms, and $R^5$ is an arylene group containing 6 to 12 carbon atoms, and $R^3$ is an optionally substituted (p+1)-valent benzene radical.

13. A photosensitive mixture as claimed in claim 1, which contains 25 to 50% by weight of diazonium salt polycondensation product, 10 to 60% by weight of polymeric binder, and 2 to 40% by weight of nonionic surface-active compound, based on the weight of nonvolatile constituents of the mixture.

14. A photosensitive mixture as claimed in claim 1, which comprises acid as stabilizer for the condensation product.

15. A photosensitive mixture as claimed in claim 14, which comprises 10 to 40% by weight of acid, based on the weight of nonvolatile constituents of the mixture.

16. A photosensitive mixture as claimed in claim 1, which comprises phosphoric acid, sulfuric acid, methane-sulfonic acid, p-toluenesulfonic acid, or citric acid for stabilization of the condensation product.

17. A photosensitive material useful for the production of printing forms comprising a base layer and a photosensitive layer, wherein the photosensitive layer comprise a mixture as claimed in claim 1.

18. A photosensitive material as claimed in claim 17, where the base layer is grained and anodized aluminum.

19. A method for the production of printing plates, which comprises imagewise exposing a photosensitive material as claimed in claim 18 and washing out the unexposed layer regions with water.

20. A method as claimed in claim 19, wherein mechanical assistance is not used to wash out the unexposed layer region with water.

21. A method as claimed in claim 20, wherein only water is used to wash out the unexposed layer.

22. A photosensitive mixture as claimed in claim 1, comprising 2 to 40% by weight of the nonionic surface-active compound, based on the weight of nonvolatile constituents of the mixture.

23. A photosensitive mixture as claimed in claim 1, comprising 4 to 20% by weight of the nonionic surface-active compound, based on the weight of nonvolatile constituents of the mixture.

24. A coated substrate obtained by applying the mixture of claim 1 onto a substrate.

* * * * *